US011211933B2

(12) United States Patent
Liu et al.

(10) Patent No.: US 11,211,933 B2
(45) Date of Patent: Dec. 28, 2021

(54) FPGA CHIP WITH DISTRIBUTED MULTIFUNCTIONAL LAYER STRUCTURE

(71) Applicant: HERCULES MICROELECTRONICS CO., LTD., Beijing (CN)

(72) Inventors: Chengli Liu, Beijing (CN); Haili Wang, Beijing (CN); Zixian Chen, Beijing (CN); Ming Ma, Beijing (CN)

(73) Assignee: HERCULES MICROELECTRONICS CO., LTD., Beijing (CN)

(*) Notice: Subject to any disclaimer, the term of this patent is extended or adjusted under 35 U.S.C. 154(b) by 0 days.

(21) Appl. No.: 16/769,061

(22) PCT Filed: Jan. 8, 2018

(86) PCT No.: PCT/CN2018/071736
§ 371 (c)(1),
(2) Date: Jun. 2, 2020

(87) PCT Pub. No.: WO2019/114070
PCT Pub. Date: Jun. 20, 2019

(65) Prior Publication Data
US 2021/0234545 A1 Jul. 29, 2021

(30) Foreign Application Priority Data

Dec. 13, 2017 (CN) .......................... 201711332437.5

(51) Int. Cl.
*H03K 19/17736* (2020.01)
*H03K 19/17796* (2020.01)
(52) U.S. Cl.
CPC ... *H03K 19/17744* (2013.01); *H03K 19/1774* (2013.01); *H03K 19/17796* (2013.01)

(58) Field of Classification Search
None
See application file for complete search history.

(56) References Cited

U.S. PATENT DOCUMENTS 6,270,350 B1 * 8/2001 Christopher ............. G09B 9/00
434/62
2008/0106288 A1 5/2008 Rosenblatt et al.

FOREIGN PATENT DOCUMENTS

CN 101546302 A 9/2009
CN 102214158 A 10/2011
(Continued)

OTHER PUBLICATIONS

International Search Report (PCT/ISA/210) dated Sep. 17, 2018, by the Chinese Patent Office as the International Searching Authority for International Application No. PCT/CN2018/071736.

*Primary Examiner* — Jany Richardson
(74) *Attorney, Agent, or Firm* — Buchanan, Ingersoll & Rooney PC (57) ABSTRACT

An FPGA chip includes one functional unit, one pre-allocation manager, and wiring segments. The functional unit includes a first module CPE and a second module PLF. The pre-allocation manager may be connected by means of one of the wiring segments. By configuring one pre-allocation manager, data transmission directions of the wiring segments may be changed. The functional unit is connected to one pre-allocation manager by means of a conventional line. The first module CPE and the second module PLF which are adjacent in the same functional unit are connected by means of a cross-connection line. The second functional modules are interconnected by means of a conventional routing system. Different functional blocks can be connected to each other from any position of a circuit.

18 Claims, 9 Drawing Sheets

(56) References Cited

FOREIGN PATENT DOCUMENTS

| CN | 103390071 A | 11/2013 |
|----|-------------|---------|
| CN | 106712751 A | 5/2017  |

* cited by examiner

FPGA CHIP WITH DISTRIBUTED MULTIFUNCTIONAL LAYER STRUCTURE

BACKGROUND OF THE INVENTION

Technical Field

The invention relates to FPGA chips, in particular to an FPGA chip with a distributed multifunctional layer structure.

Description of Related Art

Traditional programmable devices primarily consist of a logic unit array and a wiring structure and are 4*4 programmable devices. Functional modules 4 comprise routing blocks (RB) and logic blocks (LB), wherein each RB is composed of a plurality of multiplexers mux with different bit widths, and each LB is composed of a plurality of lookup tables, registers, and adders. Connection line 1 for connecting two RBs in the vertical direction may be in a direction from south to north or from north to south and have a length crossing 1-18 RB+LB. Connection line 3 for connecting two RBs in the horizontal direction may be in a direction from east to west or from west to east and have a length crossing 1-18 RB+LB. The RBs and LBs in the same functional block are connected by means of connection lines 2.

Traditional FPGAs have a redundancy over 50% due to their fixed wiring structure, and have the disadvantages of excessively large area, excessively high power consumption and too many metal layers. Such FPGAs have the advantages of sufficient connection lines between adjacent RBs, simple connection structure and low delay. The traditional structure limits the fabrication of larger devices and higher operation speeds.

BRIEF SUMMARY OF THE INVENTION

The objective of the invention is to implement two or more different functional blocks on a single chip to ensure a low connection delay, achieve a high FPGA utilization ratio, increase the number of logic gates per unit area, and reduce the power consumption of the chip.

To fulfill the above-mentioned objective, the invention provides an FPGA chip with a distributed multifunctional layer structure, which comprises at least one functional unit, at least one pre-allocation manager, and a plurality of wiring segments, wherein each of the at least one functional unit comprises a first functional module CPE and a second functional module PLF; the at least one pre-allocation manager may be connected by means of one of the plurality of wiring segments; by configuring the at least one pre-allocation manager, the data transmission directions of the plurality of wiring segments may be changed; the at least one functional unit is connected to the at least one pre-allocation manager by means of a conventional line; the first functional module CPE and the second functional module PLF which are adjacent in the same functional unit are connected by means of a cross-connection line; and the second functional modules are interconnected by means of a conventional routing system.

Preferably, the first functional modules CPE of the at least one functional unit are connected by means of the wiring segments and the pre-allocation managers to form a first network, and every two adjacent second functional modules PLF are connected by means of a traditional FPGA connection line to form a second network.

Preferably, each of the at least one functional unit comprises a first functional unit and a second functional unit, and the second functional module PLF particularly comprises a first layer of multiplexers, a second layer of multiplexers, and a logic element. The first functional module CPE of the first functional unit performs a logic operation on data and then transmits the data to the first layer of multiplexers of the first functional unit to route the data to the second functional module of the second functional unit.

Preferably, each of the at least one functional unit comprises the first functional unit and the second functional unit, and the second functional module PLF particularly comprises a first layer of multiplexers, a second layer of multiplexers, and a logic element. The first functional module CPE of the first functional unit gates data and then transmits the data to the first layer of multiplexers of the first functional unit to route the data to the second functional module of the second functional unit.

Preferably, the second functional module PLF particularly comprises a first layer of multiplexers, a second layer of multiplexers, and a logic element. The first functional module CPE performs a logic operation on data and then transmits the data to the second layer of multiplexers, the second layer of multiplexers outputs the data to the logic element, and the logic element performs an operation on the data.

Preferably, the second functional module PLF particularly comprises a first layer of multiplexers, a second layer of multiplexers, and a logic element. The first functional module CPE gates data and then transmits the data to the second layer of multiplexers, the second layer of multiplexers outputs the data to the logic element, and the logic element performs an operation on the data.

Preferably, each of the at least one functional unit comprises a first functional unit, a second functional unit and a third functional unit, and the second functional module PLF particularly comprises a first layer of multiplexers, a second layer of multiplexers, and a logic element. The first layer of multiplexers of the second functional unit receives data from the second functional module PLF of the first functional unit and routes the data to the second functional module of the third functional unit.

Preferably, each of the at least one functional unit comprises a first functional unit and a second functional unit, and the second functional module PLF particularly comprises a first layer of multiplexers, a second layer of multiplexers, and a logic element. The second layer of multiplexers of the second functional unit receives data from the second functional module PLF of the first functional unit and outputs the data to the logic element of the second functional unit to perform an operation on the data, the logic element transmits the data subjected to the logic operation to the first layer of multiplexers of the second functional unit, and the first layer of multiplexers of the second functional unit gates the data subjected to the logic operation.

Preferably, each of the at least one functional unit comprises a first functional unit and a second functional unit, and the second functional module PLF particularly comprises a first layer of multiplexers, a second layer of multiplexers, and a logic element. The first layer of multiplexers of the second functional unit receives data from the second functional module PLF of the first functional unit and routes the data to the first functional module CPE of the second functional unit, and the first functional module CPE of the second functional unit routes the data to the pre-allocation manager.

Preferably, each of the at least one functional unit comprises a first functional unit and a second functional unit, and the second functional module PLF particularly comprises a first layer of multiplexers, a second layer of multiplexers, and a logic element. The first layer of multiplexers of the second functional unit receives data from the second functional module PLF of the first functional unit and routes the data to the first functional module CPE of the second functional unit, and the first functional module CPE of the second functional unit performs an logic operation on the data and then transmits the data to the pre-allocation manager.

Preferably, each of the at least one functional unit comprises a first functional unit and a second functional unit, and the second functional module PLF particularly comprises a first layer of multiplexers, a second layer of multiplexers, and a logic element. The second layer of multiplexers of the second functional unit receives data from the second functional module PLF of the first functional unit and outputs the data to the logic element of the second functional unit to perform an operation on the data, the logic element of the second functional unit transmits the data subjected to the logic operation to the first functional module CPE of the second functional unit, and the first functional module CPE of the second functional unit routes the data to the pre-allocation manager.

Preferably, each of the at least one functional unit comprises a first functional unit and a second functional unit, and the second functional module PLF particularly comprises a first layer of multiplexers, a second layer of multiplexers, and a logic element. The second layer of multiplexers of the second functional unit receives data from the second functional module PLF of the first functional unit and outputs the data to the logic element of the second functional unit to perform an operation on the data, the logic element of the second functional unit transmits the data subjected to the logic operation to the first functional module CPE of the second functional unit, and the first functional module CPE of the second functional unit performs a logic operation on the data and then transmits the data to the pre-allocation manager.

Preferably, the wiring segments, the pre-allocation manager, and the functional unit in the same horizontal or vertical direction are located in the same clock domain.

Preferably, the wiring segments, the pre-allocation manager, and the first functional module CPE in the same horizontal or vertical direction are located in the same clock domain.

Preferably, the second functional modules PLF in the same horizontal or vertical direction are located in the same clock domain.

Preferably, different clock domains are not intersected.

Preferably, the clock domains are configured by bitfiles.

Preferably, at least one bitfile is used as a master bitfile.

According to the invention, two or more different functional blocks, which can be connected to each other from any position of a circuit, can be implemented on a single chip to ensure a low connection delay; and a high FPGA utilization ratio is achieved, the number of metal layers is decreased, the number of logic gates per unit area is increased, and the power consumption of the chip is reduced.

DETAILED DESCRIPTION OF THE INVENTION

The technical solutions of the invention are further expounded below with reference to the accompanying drawings and embodiments.

Figure 1:
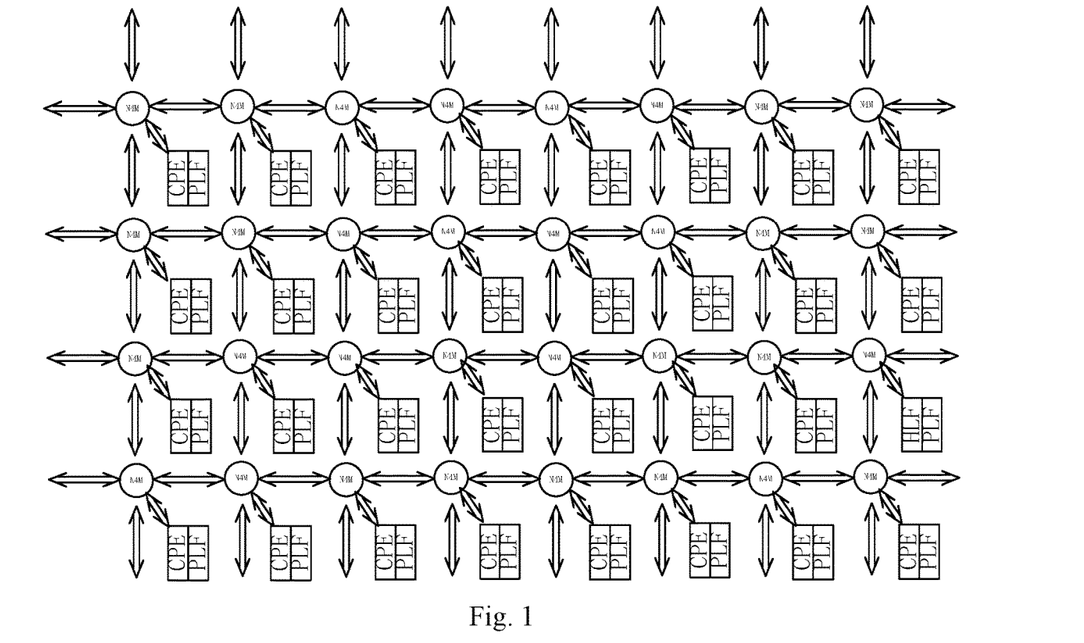
FIG. 1 is a schematic diagram of an FPGA chip with a distributed multifunctional layer structure in an embodiment.

FIG. 1 shows a schematic diagram of an FPGA chip with a distributed multifunctional layer structure in an embodiment of the invention.

As shown in FIG. 1, an embodiment of the invention provides an FPGA chip with a distributed multifunctional layer structure. In this embodiment, the distributed multifunctional layer structure comprises a plurality of functional units, a plurality of pre-allocation managers N4M, and a plurality of wiring segments.

Each functional unit comprises a first functional module CPE (Configurable Processing Element) and a second functional module PLF (Programmable Logic Function). Both the CPE and the PLF can implement a basic functional unit of an FPGA. The first functional module CPE may be used for simple logic processing, parallel processing of big data, and matrix operations, and the second functional module PLF may be used to fulfill complex logics and calculations at the bottom of hardware. Of course, those skilled in the art should appreciate that each functional unit may comprise more than one module CPE and/or more than one module PLF.

The pre-allocation managers N4M can fulfill the interconnection and intercommunication of different CPEs. One pre-allocation manager N4M may be connected to another pre-allocation manager N4M through, for example, four wiring segments to form a superior network communication structure. Each wiring segment is a pre-allocatable and programmable wiring segment and has a gating direction determined according to a programing result. It should be noted that the wiring segments has a definite direction at a certain time, that is, the same wiring segment cannot be gated in two directions at the same time.

The pre-allocation manager N4M may provide an access to the CPE. The CPE is connected to one pre-allocation manager N4M by means of a conventional line. In an embodiment, eight conventional lines are configured, wherein four of the eight conventional lines are input lines, and the other four conventional lines are output lines.

The plurality of wiring segments are pre-allocatable and programmable wiring segments and are controlled by the pre-allocation managers N4M to be programmable to select a data flow direction of the wiring segments.

The CPE and the PLF in the same functional unit are connected to each other by means of a plurality of metal lines. In an embodiment, the CPE and the PLF in the same functional unit are connected by means of 12 cross-connection lines.

One or more layers of pre-allocation managers N4M are configured, and each layer of pre-allocation managers N4M is used for processing one bit data from a certain wiring segment. In an embodiment, 48 layers of pre-allocation managers N4M may be configured, and each pre-allocation manager N4M in each layer is connected to four wiring segments to ensure that data can be transmitted in an east direction, a west direction, a south direction, and a north direction. In this case, 48 bit data in the wiring segments in the same direction can be processed at the same physical position. The pre-allocation managers N4M on different layers are mutually independent and transmit the data in these layers independently. When pre-allocation managers N4M in multiple layers are connected to the CPE, the bit data is transmitted in the multiple layers, so that the parallel operation and processing of big data are realized. It should be noted that the physical positions of the pre-allocation managers N4M in the multiple layers are overlapped in space.

Wherein, a plurality of CPEs can be configured and are connected to a plurality of pre-allocation managers N4M by means of conventional lines and connected to a plurality of PLFs by means of a plurality of metal lines.

For simplicity, the structure of one layer will be described hereinafter.

Communication paths among the plurality of CPEs in different functional units are established by means of the pre-allocation managers N4M and the pre-allocatable and programmable wiring segments to form a first network (or a superior network), and the plurality of adjacent PLFs in different functional units communicate with each other via traditional FPGA connection lines to form a second network (or a subordinate network).

The superior structure may be used to implement simple logics, parallelly process big data, and perform matrix operations, and the subordinate structure may be used to fulfill complex logics and traditional FPGA logics such as heterogeneous computations, and also has an independent configuration to control the CPEs. The above buses have the same delay in physical wiring, and the delay is shortest, so that the dynamic consumption of the buses is reduced.

For clarity, the specifics of the superior structure will be discussed first.

Figure 2:
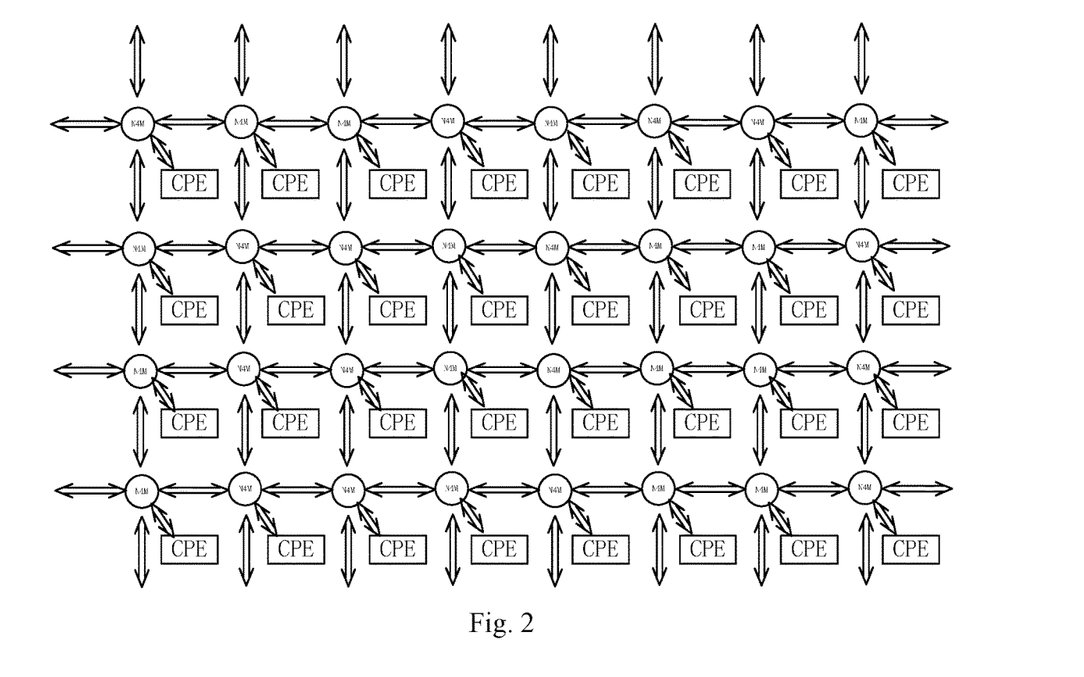
FIG. 2 is a structural diagram of a superior network in an embodiment.

FIG. 2 shows the superior network structure.

As shown in FIG. 2, different CPEs are connected by means of the pre-allocation managers N4M and the pre-allocatable and programmable wiring segments. The CPEs are connected to the pre-allocation managers N4M by means of the conventional lines referring to lines in a definite direction that will not be changed by programing. In an embodiment, the conventional line for connecting one pre-allocation manager N4M to one CPE may include four input lines and four output lines, the CPE inputs an output to the pre-allocation manager N4M via the four input lines, and the pre-allocation manager N4M may also gate different output lines for an output to the CPE.

The data transmission direction between one pre-allocation manager N4M and another pre-allocation manager N4M is controlled according to pre-allocation, and the data is output by gating the wiring segments in different directions. The directions of the pre-allocatable and programmable wiring segments are settable. However, the directions of the identical pre-allocatable and programmable wiring segments at the same moment are unique. In FIG. 2, a multi-layer communication network is formed by the pre-allocation managers N4M and the pre-allocatable and programmable wiring segments; and in one embodiment, a 48-layer communication network is formed.

Figure 3:
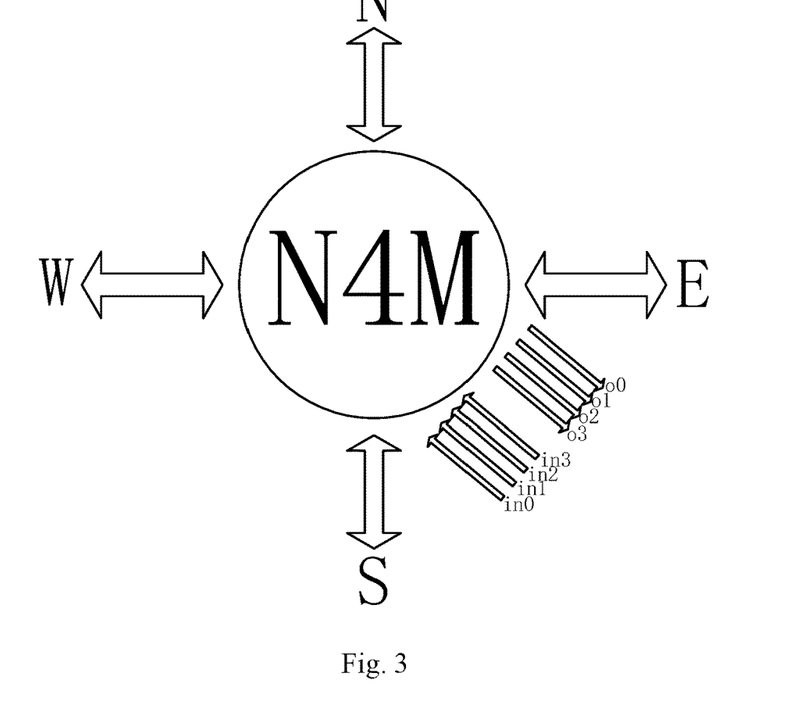
FIG. 3 is a schematic diagram of a pre-allocation manager in an embodiment.

FIG. 3 shows a connection diagram of one pre-allocation manager.

One pre-allocation manager N4M may be configured with four input lines and four output lines for the CPE as well as four pre-allocatable and programmable wiring segments in different directions. Wherein, S, N, W, and E are distributed in an upper direction, a lower direction, a left direction and a right direction of the pre-allocation manager N4M, in0, in1, in2, and in3 represent the four input lines to the CPE, and o0, o1, o2, and o3 represent the four output lines to the CPE.

Figure 4:
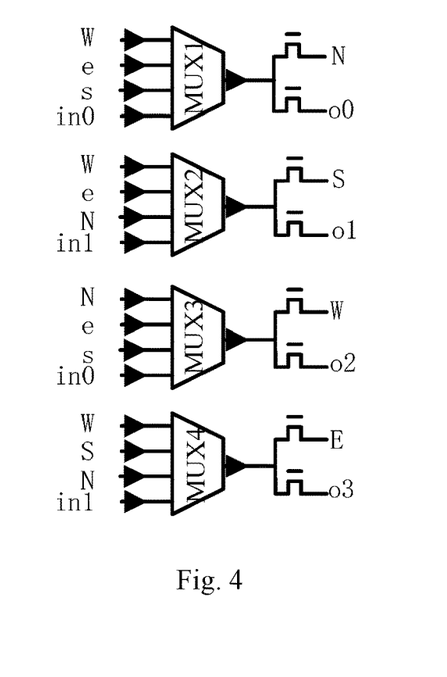
FIG. 4 is a structural diagram of the pre-allocation manager in an embodiment.

FIG. 4 shows an internal structural diagram of one pre-allocation manager.

In an embodiment, each pre-allocation manager N4M comprises four multiplexers MUX, wherein each MUX has four input terminals and two output terminals. Wherein, the input terminals of MUX1 include W, E, S, and in0, and the two output terminals of MUX1 output N or o0; the input terminals of MUX2 include W, E, N, and in1, and the two output terminals of MUX2 output S or o1; the input terminals of MUX3 include N, E, S, and in2, and the two output terminals of MUX3 output W or o2; and the input terminals of MUX4 include W, S, N, and in3, and the two output terminals of MUX4 output E or o3.

Each MUX is controlled by six signals and is stored in an SRAM. Wherein, four of the six signals form a first group to control the selection of four inputs of the MUX. It should be noted that the four signals are of a ONE HOT type, and are 0001, 0010, 0100, and 1000, and the input signal corresponding to 1 is gated as an output.

The other two of the six signals, as control signals for output control, are also of the ONE HOT type, and are 01 and 10, and the signal corresponding to 1 is gated as an output path. The six control signals are controlled by software. When the input and output of the MUX are gated at the same time, this MUX is selected.

For instance, W of MUX1 is gated to output data to the output terminal N, so that transmission from W to N is fulfilled.

E of MUX2 is gated to output data to the output terminal o1, so that transmission from E to the CPE is fulfilled.

in0 of MUX3 is gated to output data to the output terminal W, so that transmission from the CPE to W is fulfilled.

Figure 5:
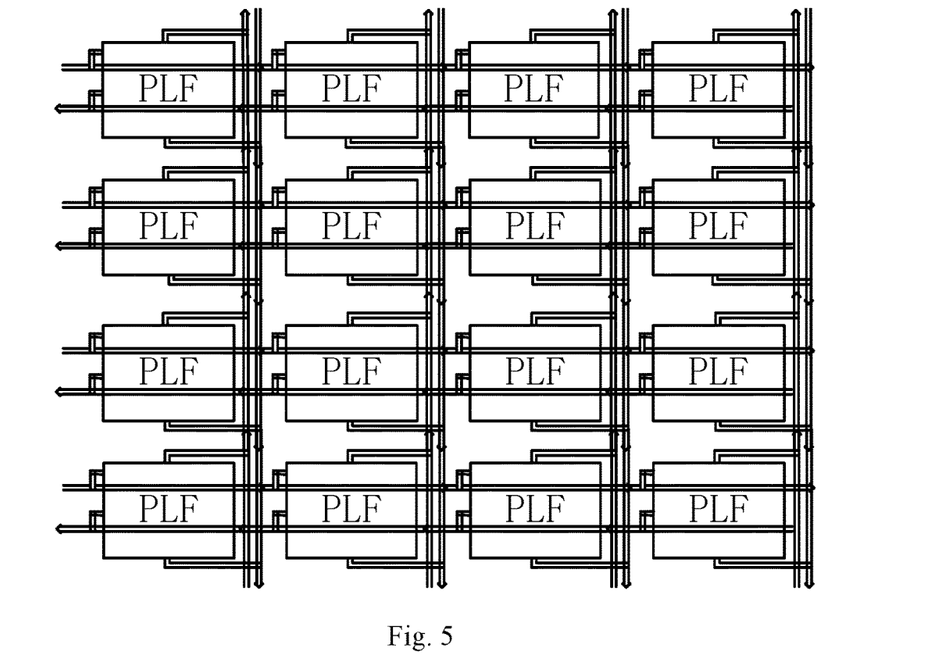
FIG. 5 is a structural diagram of a subordinate network in an embodiment.

FIG. 5 shows the subordinate network structure.

The PLFs are connected by means of traditional FPGA routing. Each PLF is directly connected to the PLFs around by means of physical lines in a constant direction. Various conventional network structures may be used as the specific structure and will no longer be repeated herein because they are not within the scope of the invention.

Figure 6:
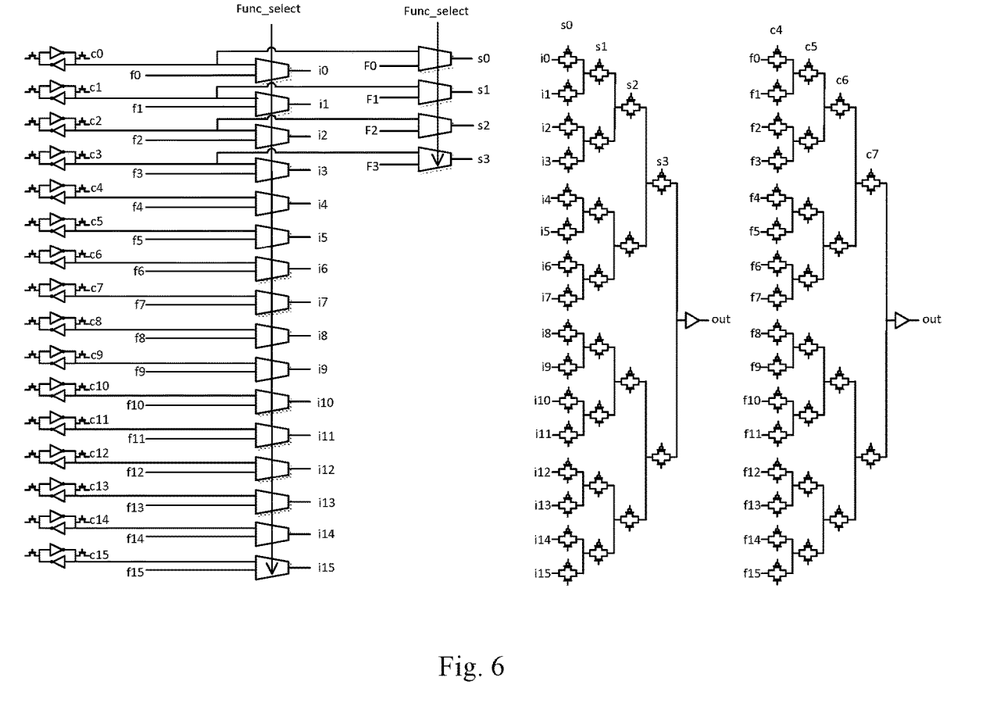
FIG. 6 is a circuit diagram of a mixed module in a CPE for implementing MUX or LUT.

FIG. 6 shows a circuit diagram of a mixed module in the CPE for implementing MUX or LUT.

Each CPE comprises a plurality of mixed modules for fulfilling the function of LUT/MUX.

SRAM bits, shown on the left of the figure, are used to store corresponding data. Wherein, SRAM bits c0-c15 represent input signals of the mixed module when the mixed module is used as the lookup table LUT, and f0-f15 represent input signals of the mixed module when the mixed module is used as the multiplexer MUX.

Each register unit in the SRAM is correspondingly connected to one input terminal of a one-out-of-two MUX in an input selection unit, the other input terminal of the one-out-of-two MUX in the input selection unit receives the external routing input signals f0-f15, and input signals i0-i15 of the mixed module are output with a selection control bit Func_select as a control signal of the one-out-of-two MUX in the input selection unit.

Each of the four one-out-of-two MUXs in a control selection unit has a first input terminal for receiving c0-c3 of the SRAM and a second input terminal for receiving any four external inputs F0-F3, and control signals s0-s3 of the mixed module are output with a selection control bit Func_select as a control signal of the one-out-of-two MUXs in the control selection unit.

The mixed module comprises four layers of COMS transmission gates. Wherein the COMS transmission gates in the first layer receive output signals i0-i15 of the input selection unit. Every two adjacent COMS transmission gates in the first layer form a group, have opposite connection directions, and achieve a one-of-out-two function according to the control signal s0; the second layer includes eight COMS transmission gates, the receiving terminals of the eight COMS transmission gates receive output results from the COMS transmission gates in the first layer, and the one-of-out-two function is achieved according to the control signal s1; by analogy, the fourth layer includes two COMS transmission gates which receive output results from the COMS transmission gates in the third layer and achieve the one-of-out-two function according to the control signal s3, so that a unique result is output.

A multi-path selection module includes at least one multiplexer (only one multiplexer is shown in FIG. 6), and all the multiplexers have similar structures and different control signals. The multiplexer comprises four layers of COMS transmission gates. The COMS transmission gates in each layer are controlled to be gated according to the SRAM bits, and every two adjacent COMS transmission gates form a group and have opposite connection directions. The COMS transmission gates in the first layer receive the external routing input signals f0-f15 and achieve the one-out-of-two function according to a control signal c4. The second layer includes eight COMS transmission gates, the receiving terminals of the eight COMS transmission gates receive the output results from the COMS transmission gates in the first layer, and the one-out-of-two function is achieved according to a control signal c5. By analogy, the fourth layer includes two COMS transmission gates which receive the output results from the COMS transmission gates in the third layer and achieve the one-out-of-two function according to a control signal c7, so that a unique result is output.

When Func_select 0 is selected, the mixed module in the CPE is used as LUT, and when Func_select 1 is selected, the mixed module in the CPE is used as MUX.

Figure 7:
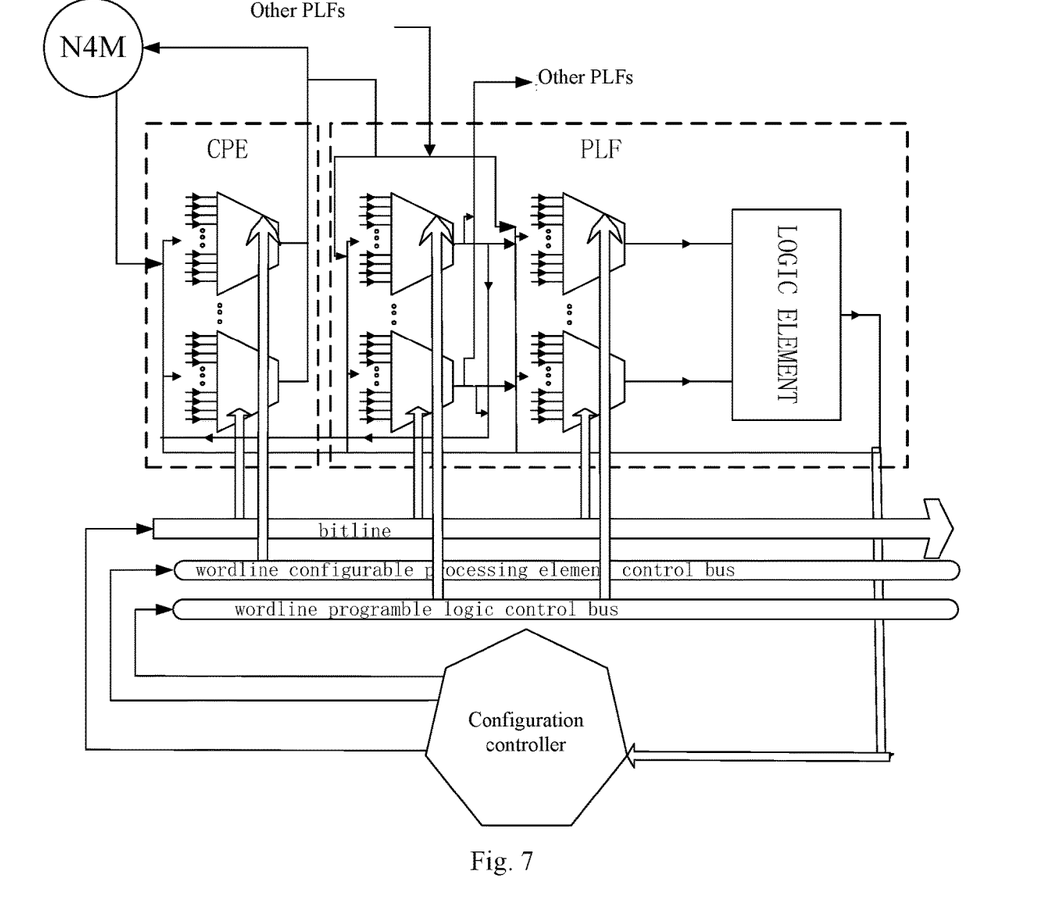
FIG. 7 is a circuit implementation diagram of the module CPE and a module PLF in the same unit.

FIG. 7 shows a circuit implementation diagram of the module CPE and the module PLF in the same unit.

Figure 8:
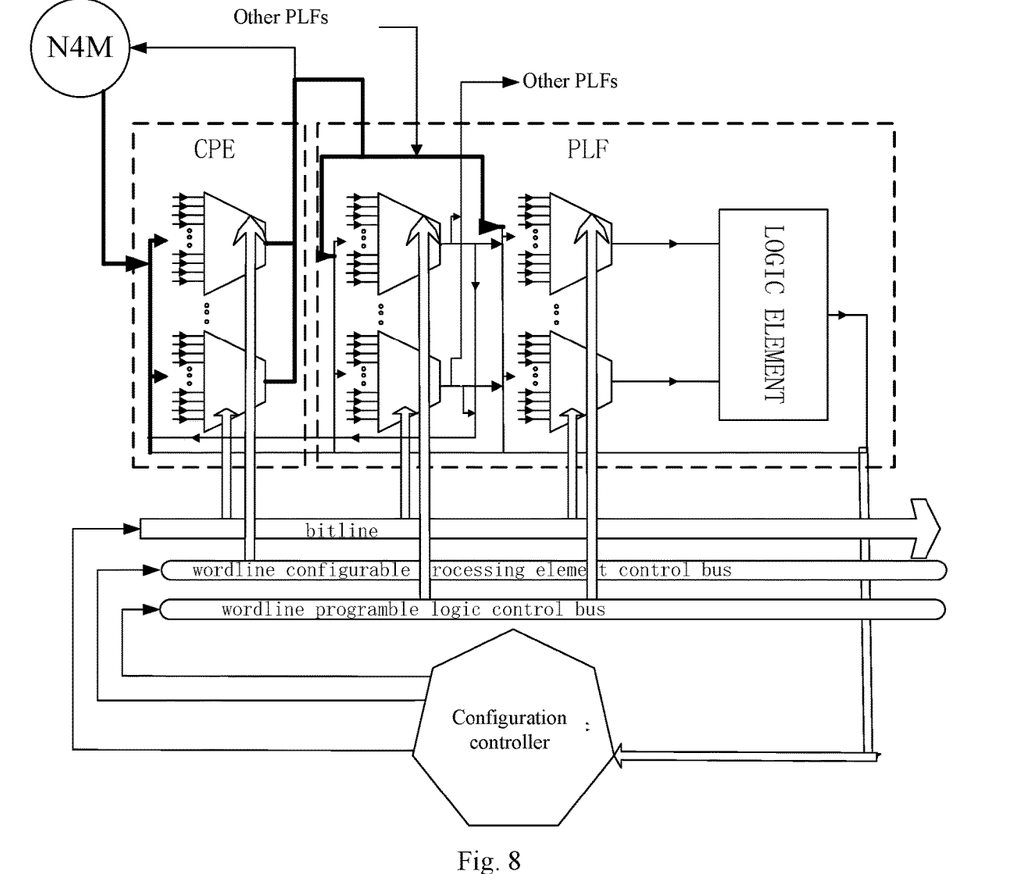
FIG. 8 is a schematic diagram of data transmission from the CPE to the PLF in the same unit.

FIG. 8 is a schematic diagram of data transmission from the CPE to the PLF in the same unit.

Figure 9:
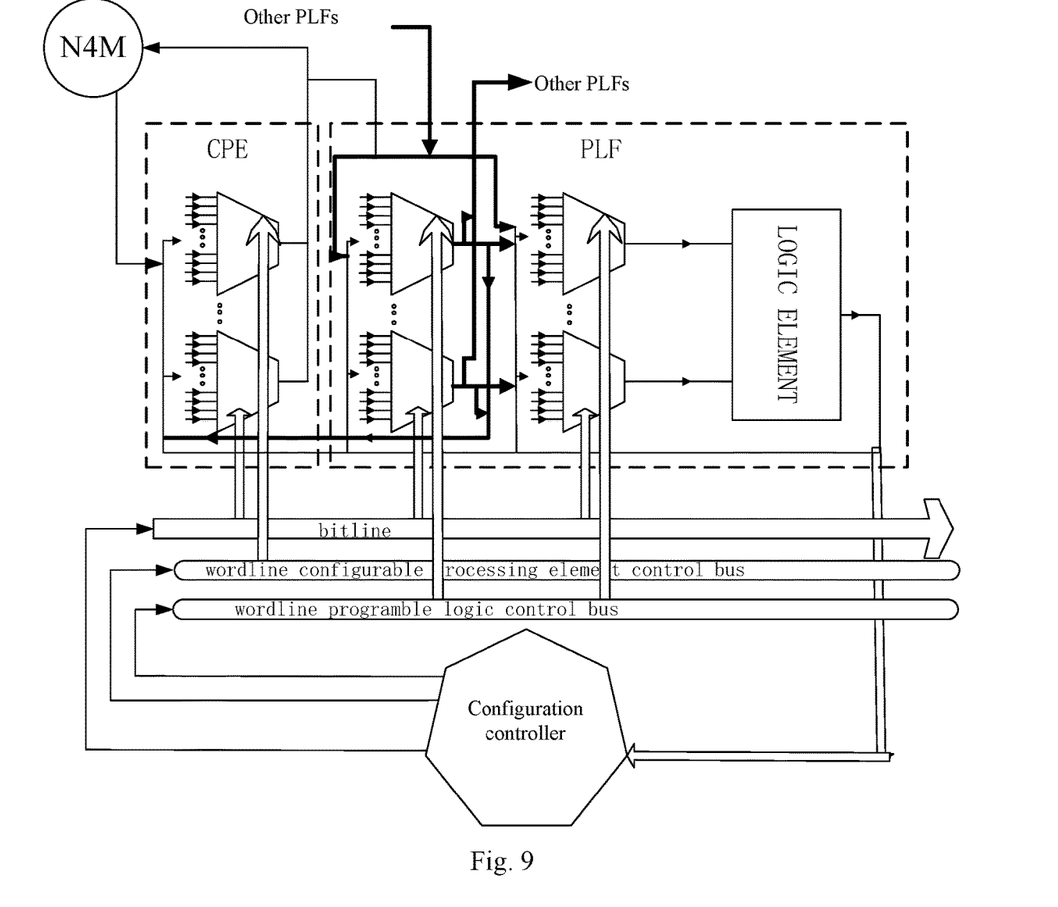
FIG. 9 is a schematic diagram of data transmission from the PLF to the CPE in the same unit.

FIG. 9 is a schematic diagram of data transmission from the PLF to the CPE in the same unit.

FIGS. 7, 8, and 9 show the input and output between the CPE and the PLF in one functional unit. FIG. 7 includes a basic unit implementation circuit of the CPE and the PLF. Furthermore, the CPE and the PLF can be dynamically controlled by each other.

FIG. 7 shows the CPE and the PLF in the same functional unit.

The CPE on the left includes a plurality of LUT/MUX. In an embodiment, 48 layers of pre-allocation managers N4M are configured, and an output of each layer of pre-allocation managers N4M corresponds to one LUT/MUX, and there are totally 48 LUT/MUX in the CPE. As the case maybe, the LUT/MUX can be selected to serve as LUT or MUX. When the LUT/MUX is selected to serve as LUT, the CPE executes a corresponding function; and when the LUT/MUX is selected to serve as MUX, the CPE executes a gating function, that is, data is transmitted to other units by the CPE.

Each LUT/MUX has a plurality of inputs, and a bitline transmits data to each input terminal first. A wordline configurable processing element control bus transmits control signals to each LUT/MUX to control the gating and output of the LUT/MUX. Each LUT/MUX is controlled by the bitline and the wordline configurable processing element control bus jointly, and any input can be selected to pass through any LUT/MUX.

The PLF includes a first PLF layer, a second PLF layer, and a LOGIC ELEMENT, wherein the first PLF layer and the second PLF layer are two layers of MUXs, and each MUX has a plurality of inputs. The bitline inputs data to the inputs of the MUXs in the first PLF layer and the second PLF layer. After the bitline transmits all the data to each input terminal, a second wordline programmable logic control bus transmits the control signals to the MUXs in the first PLF layer and the second PLF layer to control the gating of the corresponding MUXs. The bitline, the wordline configurable processing element control bus, and the wordline programmable logic control bus are controlled by a configuration controller. The bitline simultaneously controls data transmission channels of the CPE and the PLF. Through the bitline and the wordline configurable processing element control bus, any data input to the CPE can be selected to pass through any LUT/MUX; and through the bitline and the wordline programmable logic control bus, any data input to the PLF can be selected to pass through any MUX.

Wherein, the CPE can receive information from the pre-allocation managers N4M connected to the CPE, the LOGIC ELEMENT in the same functional unit, and the PLF in the same functional unit, and can transmit information to the pre-allocation managers N4M connected to the CPE, and the two PLF layers in the same functional unit.

The first PLF layer can receive information from the CPE in the same functional unit, the PLF in another functional unit, and the LOGIC ELEMENT in the same functional unit, and can transmit information to the second PLF layer, the CPE in the same functional unit, and the two PLF layers in another functional unit.

The second PLF layer can receive information output by the first PLF layer, the CPE in the same functional unit, and the LOGIC ELEMENT in the same functional unit, and can transmit information to the LOGIC ELEMENT in the same functional unit.

The LOGIC ELEMENT can receive data output by the second PLF layer and can output the data to the input terminals of the two PLF layers in the same functional unit or to the input terminals of the CPE in the same functional unit via an output terminal. Furthermore, the LOGIC ELEMENT feeds the information back to the configuration controller to change the control of the corresponding bus over the LUT/MUX.

The configuration controller controls the corresponding bitline, wordline configurable processing element control bus and wordline programmable logic control bus to dynamically configure the configuration information of the CPE and the PLF according to the feedback information received from the LOGIC ELEMENT. In an embodiment, the PLF feeds information back to the configuration controller by means of the LOGIC ELEMENT in the PLF to dynamically configure the CPE. In another embodiment, the CPE transmits information to the PLF and then feeds the information back to the configuration controller by means of the LOGIC ELEMENT to dynamically configure the PLF so as to achieve corresponding functions. The process of information transmission between the CPE and the PLF is particularly described hereinafter.

FIG. 8 shows a process of data transmission from the CPE to the PLF.

Wherein, data from the pre-allocation manager N4M is transmitted to the CPE via the conventional line; when a logic function needs to be achieved, the LUTs/MUXs in the CPE are used as LUTs; when a gating function needs to be achieved, the LUTs/MUXs in the CPE are used as MUXs. The data is returned to the pre-allocation manager N4M connected to the CPE or is transmitted to two MUXs in the PLF connected to the CPE after being transmitted to the CPE.

In an embodiment, data is subjected to a logic operation by the CPE and is then routed to another PLF by the PLF. Particularly, data from the pre-allocation manager N4M achieves the logic function through the LUTs in the CPE, and output data is transmitted to the MUXs in the first PLF layer to be routed and is finally transmitted to another PLF.

In another embodiment, data is routed by the CPE and is then routed to another PLF by the PLF. Particularly, data from the pre-allocation manager N4M is routed by the MUXs in the CPE, and output data is transmitted to the MUXs in the first PLF layer to be routed and is finally transmitted to another PLF.

In another embodiment, data is subjected to the logic operation by the CPE and is then subjected to a logic operation by the PLF. Particularly, data from the pre-allocation manager N4M achieves the logic function through the LUTs in the CPE, and output data is transmitted to the MUXs in the second PLF layer and is gated by the MUXs in the second PLF layer to be transmitted to the LOGIC ELEMENT to finally achieve the logic function.

In another embodiment, data is routed by the CPE and is then subjected to a logic operation by the PLF. Particularly, data from the pre-allocation manager N4M is routed by the MUXs in the CPE, and output data is transmitted to the MUXs in the second PLF layer and is gated by the MUXs in the second PLF layer to be transmitted to the LOGIC ELEMENT to finally achieve the logic function.

FIG. 9 shows a process of information transmission from the PLF to the CPE.

Wherein, data from another PLF enters the first PLF layer or the second PLF layer. After entering the first PLF layer, the data is gated by the MUXs to be transmitted to the CPE connected to the first PLF layer; and the first PLF layer transmits the data to another PLF by means of routing. After entering the second PLF layer, the data is gated by the MUXs to be transmitted to the LOGIC ELEMENT.

In an embodiment, data is routed by the PLF and is then transmitted to another PLF. Particularly, data from another PLF is transmitted to the MUXs in the first PLF layer and is then gated by the corresponding MUXs to be transmitted to another PLF to be routed.

In another embodiment, data is subjected to a logic operation by the PLF and is then transmitted to another PLF. Particularly, data from another PLF is transmitted to the MUXs in the second PLF layer and is gated by the MUXs in the second PLF layer to be transmitted to the LOGIC ELEMENT to achieve the logic function. Then the data output by the LOGIC ELEMENT is transmitted to the first PLF layer and is gated by the corresponding MUXs to be transmitted to another PLF to be routed.

In another embodiment, data is routed by the PLF and is then transmitted to the CPE to be routed. Particularly, data from another PLF is transmitted to the MUXs in the first PLF layer, is gated by the corresponding MUXs to be transmitted to MUX in the CPE, and is then gated by the corresponding MUXs to be routed.

In another embodiment, data is routed by the PLF and is then transmitted to the CPE to achieve the logic function. Particularly, data from another PLF is transmitted to the MUXs in the first PLF layer and is gated by the corresponding MUXs to be transmitted to the LUTs in the CPE to achieve the logic function.

In another embodiment, data is subjected to a logic operation by the PLF and is then transmitted to the CPE to be routed. Particularly, data from another PLF is transmitted to the MUXs in the second PLF layer and is gated by the MUXs in the second PLF layer to be transmitted to the LOGIC ELEMENT to achieve the logic function. Then, data output by the LOGIC ELEMENT is transmitted to the MUXs in the CPE and is gated by the corresponding MUXs to be routed.

In another embodiment, data is subjected to a logic operation by the PLF and is then transmitted to the CPE to achieve the logic function. Particularly, data from another PLF is transmitted to the MUXs in the second PLF layer and is gated by the MUXs in the second PLF layer to be transmitted to the LOGIC ELEMENT to achieve the logic function. Then, data output by the LOGIC ELEMENT is transmitted to LUT in the CPE to achieve the logic function.

Figure 10:
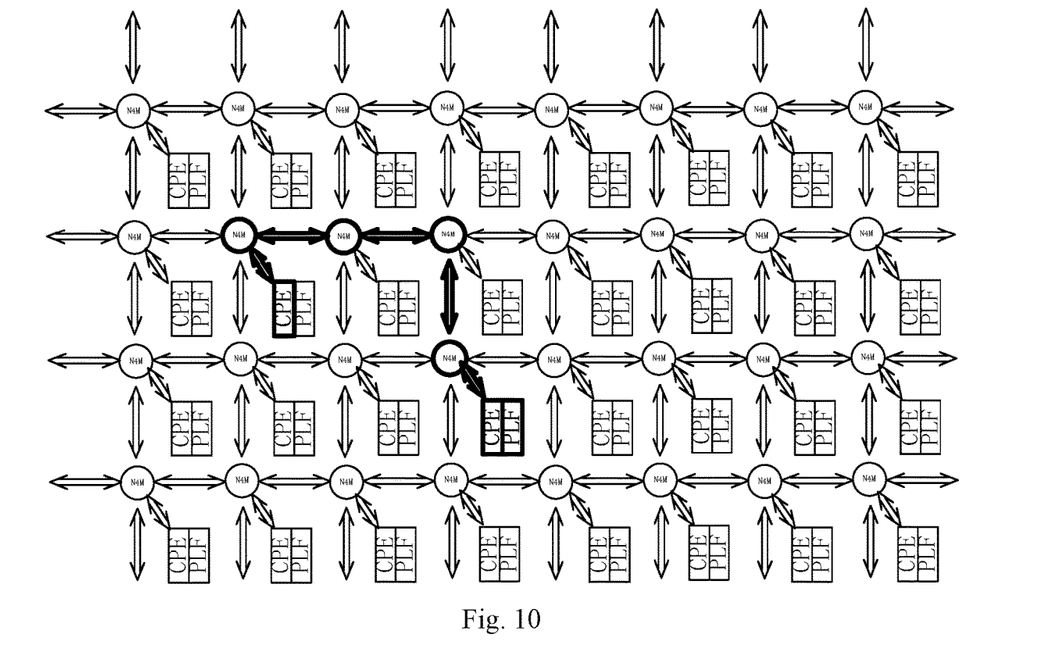
FIG. 10 is a communication diagram of CPEs in two different functional units.

FIG. 10 is a communication diagram of the CPE and the PLF in two functional units.

In an embodiment, the first CPE transmits data to the pre-allocation manager N4M connected to the first CPE via one conventional line, then the pre-allocation manager N4M configures the direction of the pre-allocatable and programmable wiring segments, the data passes through a plurality of wiring segments and a plurality of pre-allocation managers N4M and is then transmitted to the second CPE by means of one conventional line, and the second CPE transmits the information to the second PLF connected to the second CPE in an manner shown in FIG. 8. In this embodiment, the data is transmitted eastwards twice and is then transmitted southwards.

Figure 11:
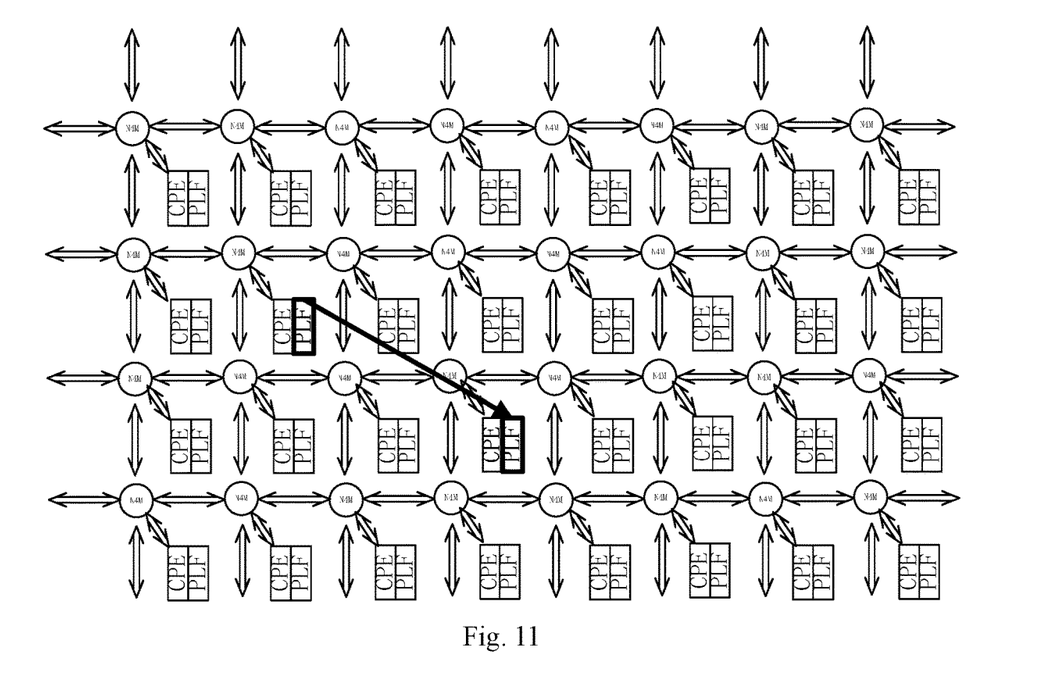
FIG. 11 is a communication diagram of PLFs in two different functional units.

FIG. 11 shows is a communication diagram of the PLF and the CPE in two different functional units.

In an embodiment, the PLF in the first functional unit transmits data to the PLF in the second function unit by means of the traditional FPGA connection line, and then the PLF in the second function unit transmits the information to the CPE in the second function unit in a manner shown in FIG. 9.

Figure 12:
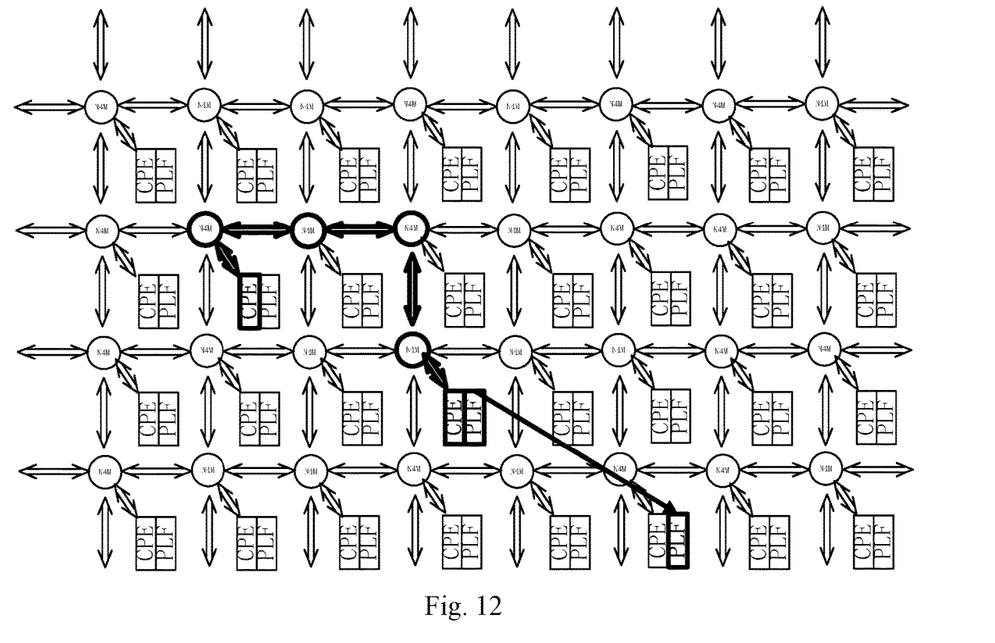
FIG. 12 is a communication diagram of CPEs to PLFs in multiple different functional units.

FIG. 12 is a communication diagram of the CPEs to the PLFs in multiple different functional units.

In an embodiment, the CPE in the first functional unit transmits data to the PLF in the second functional unit via the superior network, and the PLF in the second functional unit transmits the data to the PLF in the third functional unit by means of the traditional FPGA connection line in the subordinate network.

Figure 13:
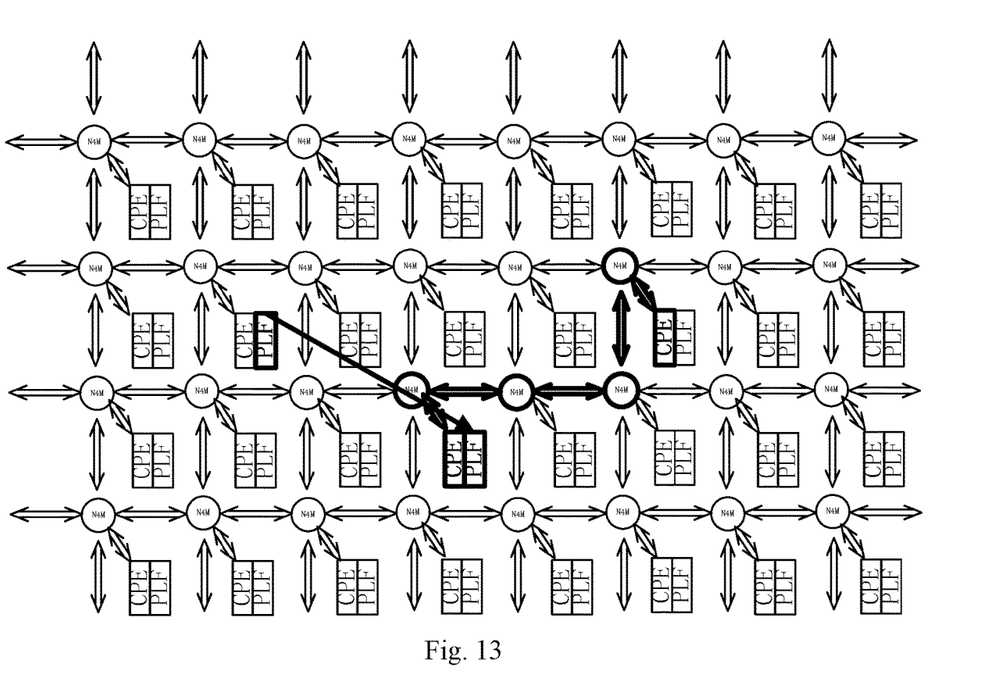
FIG. 13 is a communication diagram of PLFs to CPEs in multiple different functional units.

FIG. 13 is a communication diagram of the PLFs to the CPEs in multiple different functional units.

In an embodiment, the PLF in the first functional unit transmits data to the CPE in the second functional unit by means of the traditional FPGA connection line in the subordinate network, and the CPE in the second functional unit transmits the data to the CPE in the third functional unit via the superior network.

As shown in FIG. 10-13, a distributed computation is fulfilled by transmission of data from different positions in the same multifunctional layer. Multiple idle clock domains are used to achieve different functions to fulfill a multifunctional layer characteristic, and a programmable device with a distributed multifunctional layer is exhibited in the chip. It should be noted that the paths are selected by software particularly according to actual weights and requirements in the above method.

Figure 14:
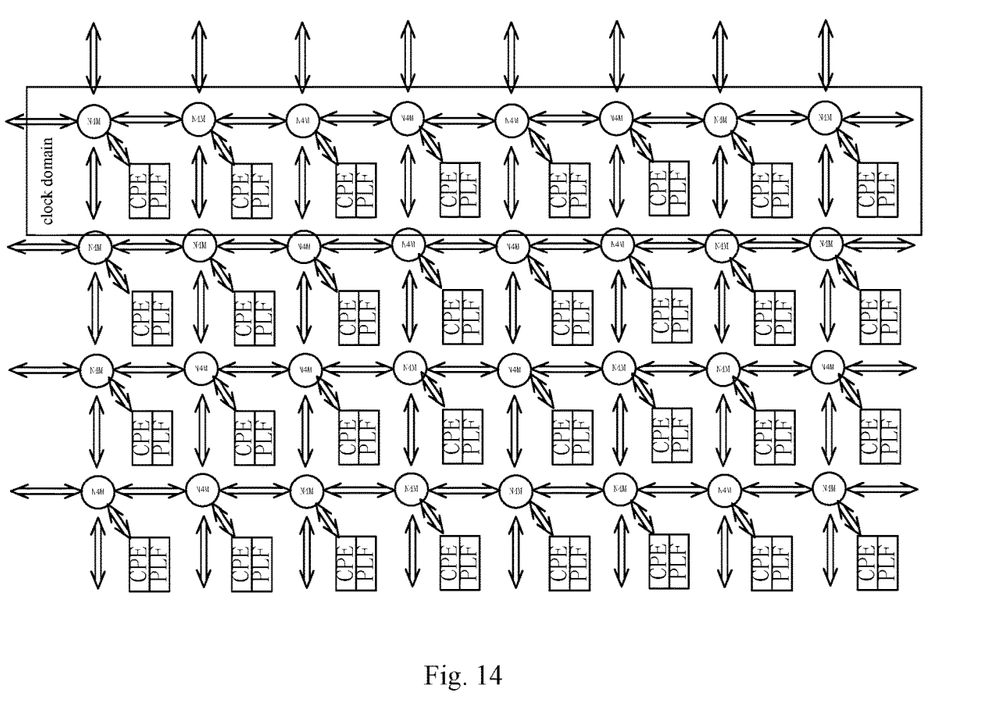
FIG. 14 is a schematic diagram of clock domains in an embodiment.

FIG. 14 is a schematic diagram of clock domains in an embodiment.

In an embodiment, the CPE, the pre-allocation manager N4M, and the pre-allocatable and programmable wiring segments in the same horizontal or vertical direction may form one clock domain, the PLFs connected by means of the traditional FPGA connection line in the same horizontal or vertical direction may form one clock domain, and the CPE, the pre-allocation manager N4M, the pre-allocatable and programmable wiring segments, and the PLF in the same horizontal or vertical direction may also form one clock domain. In an embodiment, as shown in FIG. 14, there may be only one clock domain, or there may be eight clock domains at most. For instance, eight clock domains are formed between adjacent CPEs in the horizontal or vertical direction and adjacent PLFs in the horizontal or vertical direction; or as shown in FIG. 14, the top CPE and the top PLF in the same horizontal or vertical direction form one clock domain, other CPEs in the same horizontal direction form one clock domain, other PLFs in the same horizontal direction form one clock domain, and there are seven clock domains in total; or as shown in FIG. 14, two rows of top CPEs in the same horizontal direction form one clock domain, other CPEs in the same horizontal direction form one clock domain, other PLFs in the same horizontal direction form one clock domain, and there are seven clock domains in total.

In another embodiment, all the PLFs may form one clock domain, and all the CPEs may form one clock domain. It should be noted that, in the above embodiments, the number of the clock domains may be the number of any combinations of the several adjacent clock domains mentioned above.

Each clock domain has a bitfile. One bitfile is selected to serve as a master bitfile. Generally, one clock domain of the PLF is selected as the master bitfile, or one clock domain of the CPE is selected as the master bitfile. The master bitfile is used to control the loading and reconfiguration of all the bitfiles.

Each clock domain has an independent bitline, an independent wordline configurable processing element control bus, an independent wordline programmable logic control bus, and an independent configuration controller.

Different clock domains have different functions to fulfill the multifunctional layer characteristic. In an embodiment, the CPEs and the PLFs are distributed across the chip to fulfill a distributed characteristic. Each CPE is independently connected to each PLF. By means of the multifunctional layer characteristic fulfilled through different clock domains, a simplex programmable chip can achieve traditional FPGA+CPU/GPU functions.

In an embodiment, the master bitfile is written into one PLF via the corresponding bitline and the corresponding wordline programmable logic control bus to achieve one major function of the clock domain where the PLF is located, the PLF requests to load the bitfile in one CPE through the LOGIC ELEMENT in the PLF and feeds data back to the configuration controller, the configuration controller controls the bitline and the wordline configurable processing element control bus, and finally the bitfile of the CPE is written into the CPE to achieve the corresponding function. In this embodiment, dynamic loading of the CPE is controlled by using the typical PLF as a MASTER. Those skilled in the art should note that this embodiment is one possible implementation, and one clock domain of the CPE or other clock domains may also be selected as the MASTER to configure dynamic loading of other clock domains.

The objectives, technical solutions, and beneficial effects of the invention are further expounded in the specific embodiments described above. It should be understood that the above embodiments are only illustrative ones of the invention, and are not intended to limit the protection scope of the invention. Any modifications, equivalent substitutions, improvements, and the like achieved based on the spirit and principle of the invention should also fall within the protection scope of the invention.

What is claimed is:

1. An FPGA chip with a distributed multifunctional layer structure, comprising at least one functional unit, at least one pre-allocation manager, and a plurality of wiring segments, wherein:

different functional units of the at least one functional unit include first and second functional modules, each of the at least one functional unit comprising a first functional module (CPE) of the first functional modules and a second functional module (PLF) of the second functional modules;

the at least one pre-allocation manager may be connected by means of one of the plurality of wiring segments; and by configuring the at least one pre-allocation manager, data transmission directions of the plurality of wiring segments may be changed;

the at least one functional unit is connected to the at least one pre-allocation manager by means of a conventional line;

the first functional module (CPE) and the second functional module (PLF) which are adjacent in the same functional unit are connected by means of a cross-connection line; and the second functional modules of the different functional units are interconnected by means of a conventional routing system.

2. The FPGA chip according to claim 1, wherein the first functional modules (CPE) of the at least one functional unit are connected by means of the wiring segments and the pre-allocation managers to form a first network, and every two adjacent said second functional modules (PLF) are connected by means of a traditional FPGA connection line to form a second network.

3. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the first functional module (CPE) of the first functional unit performs a logic operation on data and then transmits the data to the first layer of multiplexers of the first functional unit to route the data to the second functional module of the second functional unit.

4. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the first functional module (CPE) of the first functional unit gates data and then transmits the data to the first layer of multiplexers of the first functional unit to route the data to the second functional module of the second functional unit.

5. The FPGA chip according to claim 1, wherein the second functional module (PLF) particularly comprises a first layer of multiplexers, a second layer of multiplexers, and a logic element; and the first functional module (CPE) performs a logic operation on data and then transmits the data to the second layer of multiplexers, the second layer of multiplexers outputs the data to the logic element, and the logic element performs an operation on the data.

6. The FPGA chip according to claim 1, wherein the second functional module (PLF) particularly comprises a first layer of multiplexers, a second layer of multiplexers, and a logic element; and the first functional module (CPE) gates data and then transmits the data to the second layer of multiplexers, the second layer of multiplexers outputs the data to the logic element, and the logic element performs an operation on the data.

7. The structure FPGA chip according to claim 1, wherein each of the at least one functional unit comprises a first functional unit, a second functional unit, and a third functional unit, and the second functional module (PLF) particularly comprises a first layer of multiplexers, a second multiplexers, and a logic element; and the first layer of multiplexers of the second functional unit receives data from the second functional module (PLF) of the first functional unit and routes the data to the second functional module of the third functional unit.

8. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the second layer of multiplexers of the second functional unit receives data from the second functional module (PLF) of the first functional unit and outputs the data to the logic element of the second functional unit to perform an operation on the data, the logic element transmits the data subjected to the logic operation to the first layer of multiplexers of the second functional unit, and the first layer of multiplexers of the second functional unit gates the data subjected to the logic operation.

9. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the first layer of multiplexers of the second functional unit receives data from the second functional module (PLF) of the first functional unit and routes the data to the first functional module (CPE) of the second functional unit, and the first functional module (CPE) of the second functional unit routes the data to the pre-allocation manager.

10. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the first layer of multiplexers of the second functional unit receives data from the second functional module (PLF) of the first functional unit and routes the data to the first functional module (CPE) of the second functional unit, and the first functional module (CPE) of the second functional unit performs a logic operation on the data and then transmits the data to the pre-allocation manager.

11. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the second layer of multiplexers of the second functional unit receives data from the second functional module (PLF) of the first functional unit and outputs the data to the logic element of the second functional unit to perform an operation on the data, the logic element of the second functional unit transmits the data subjected to the logic operation to the first functional module (CPE) of the second functional unit, and the first functional module (CPE) of the second functional unit routes the data to the pre-allocation manager.

12. The FPGA chip according to claim 1, wherein each of the at least one functional unit comprises a first functional unit and a second functional unit, and the second functional module (PLF) particularly comprises a first layer of multiplexers, a second layer of multiplexers, and a logic element; and the second layer of multiplexers of the second functional unit receives data from the second functional module (PLF) of the first functional unit and outputs the data to the logic element of the second functional unit to perform an operation on the data, the logic element of the second functional unit transmits the data subjected to the logic operation to the first functional module (CPE) of the second functional unit, and the first functional module (CPE) of the second functional unit performs the logic operation on the data and then transmits the data to the pre-allocation manager.

13. The FPGA chip according to claim 1, wherein the wiring segment, the pre-allocation manager, and the functional unit in a same horizontal or vertical direction are located in a same clock domain.

14. The FPGA chip according to claim 13, wherein different clock domains are not intersected.

15. The FPGA chip according to claim 13, wherein the clock domains are configured by bitfiles.

16. The FPGA chip according to claim 15, wherein at least one said bitfile is used as a master bitfile.

17. The FPGA chip according to claim 1, wherein the wiring segment, the pre-allocation manager, and the first functional module (CPE) in a same horizontal or vertical direction are located in a same clock domain.

18. The FPGA chip according to claim 1, wherein the second functional modules (PLF) in a same horizontal or vertical direction are located in a same clock domain.

* * * * *